(12) United States Patent
Nakamura

(10) Patent No.: US 6,225,573 B1
(45) Date of Patent: May 1, 2001

(54) METHOD FOR MOUNTING TERMINAL ON CIRCUIT BOARD AND CIRCUIT BOARD

(75) Inventor: Satoshi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/180,978

(22) PCT Filed: May 30, 1997

(86) PCT No.: PCT/JP97/01869

§ 371 Date: Nov. 18, 1998

§ 102(e) Date: Nov. 18, 1998

(87) PCT Pub. No.: WO97/46060

PCT Pub. Date: Dec. 4, 1997

(30) Foreign Application Priority Data

May 31, 1996 (JP) ................................ 8-138036

(51) Int. Cl.⁷ ........................ H01R 12/04; H05K 1/11
(52) U.S. Cl. ........................ 174/267; 29/842; 29/843; 174/261
(58) Field of Search ........................ 174/259, 260, 174/261, 267; 361/772, 773, 774, 776, 767, 783; 257/666, 735, 779; 29/842, 843

(56) References Cited

U.S. PATENT DOCUMENTS

| | | | |
|---|---|---|---|
| 5,081,764 | * 1/1992 | Utunomiya et al. | 29/843 |
| 5,386,087 | * 1/1995 | Lee et al. | 174/261 |
| 5,559,316 | * 9/1996 | Tomoda | 257/666 |
| 5,894,165 | * 4/1999 | Ma et al. | 257/666 |
| 5,969,413 | * 10/1999 | Yano et al. | 257/673 |
| 6,060,769 | * 5/2000 | Wark | 257/666 |
| 6,078,097 | * 6/2000 | Ohsawa | 257/666 |

FOREIGN PATENT DOCUMENTS

| | | |
|---|---|---|
| 48-31459 | 4/1973 | (JP) . |
| 49-28876 | 3/1974 | (JP) . |
| 52-118262 | 10/1977 | (JP) . |
| 58-111394 | 7/1983 | (JP) . |
| 60-107896 | 6/1985 | (JP) . |
| 60-260192 | 12/1985 | (JP) . |
| 63-296391 | 12/1988 | (JP) . |
| 2-110994 | 4/1990 | (JP) . |
| 3-225998 | 10/1991 | (JP) . |
| 4-271190 | 9/1992 | (JP) . |
| 7-235762 | 9/1995 | (JP) . |
| 9-107173 | 4/1997 | (JP) . |

* cited by examiner

*Primary Examiner*—Jeffrey Gaffin
*Assistant Examiner*—Jeremy Norris
(74) *Attorney, Agent, or Firm*—Merchant & Gould P.C.

(57) ABSTRACT

There are provided a coating step for coating solder paste (3) onto the circuit board (1), a superimposing step for superimposing a connecting end (4a) of a terminal (4) also having a non-connecting end (4b) on the regions coated with solder paste (3), and a heating step for heating and melting the solder paste (3) in order to solder the connecting end (4a) onto the circuit board (1). A further step for coating adhesive material (6) onto the circuit board (1) is provided, and in the aforementioned superimposing step, the connecting end (4a) is brought into contact with the regions coated with the adhesive material (6). In the aforementioned heating step, the solder paste (3) is heated and caused to melt whilst the connecting end (4a) is in a bonded state with respect to the circuit board (1) by means of the adhesive material (6).

15 Claims, 15 Drawing Sheets

METHOD FOR MOUNTING TERMINAL ON CIRCUIT BOARD AND CIRCUIT BOARD

TECHNICAL FIELD

The present invention relates to a method for installing terminals on a circuit board comprising desired electronic circuits and electrical circuits, and to a circuit board used in this method.

BACKGROUND ART

FIG. 28 shows one example of a conventional structure wherein terminals are installed on a circuit board. In the structure illustrated in this diagram, terminal 9 has a thin plate shape and is made from metal, and it comprises a connecting end 9a and a non-connecting end 9b. The connecting end 9a is soldered to the circuit board 1K, whilst the non-connecting end 9b projects externally from the circuit board 1K. By adopting a composition of this kind, it is possible to bend the aforementioned non-connecting end, if necessary, as indicated by the imaginary line in the diagram, and this is convenient for making the non-connecting end 9b into the electrode of a cell, or the terminal of a further circuit board, or the like.

Since the task of soldering the aforementioned terminal 9 to the circuit board is carried out manually by an operator, the work efficiency is poor. Therefore, conventionally, reflow soldering has been adopted as a method for soldering the aforementioned terminal 9. This reflow soldering method comprises a step of coating solder paste onto the surface of the circuit board 1K, a step of superimposing the aforementioned connecting end 9a over the region of the board coated with the solder paste, and a step of heating and melting the aforementioned solder paste, and this sequence of steps can be automated.

However, in the prior art, the following problems occur when the connecting end 9a is soldered to the circuit board 1K by means of a reflow soldering method.

Namely, as shown in FIG. 29 for example, in a case where the two end regions 9c, 9d of a terminal 9A of a set length are superimposed on two regions 35, 35 coated with solder paste, a self-alignment effect is obtained. This is due to the fact that when the solder paste in the aforementioned two regions 35, 35 coated with solder paste are heated and melted, the surface tension of the molten solder acts respectively on each end region 9c, 9d, and a force aligning the whole of the terminal 9A with the aforementioned two solder paste coated regions 35, 35 is exhibited. In order to obtain a self-alignment effect in this way by using a reflow soldering method, it is necessary for the surface tension of the molten solder to act on the terminal at a plurality of points.

However, in the structure illustrated in FIG. 28, only connecting end 9a of the aforementioned terminal 9 is soldered to the circuit board 1K, and therefore the surface tension of the molten solder only acts on this portion of the terminal. Therefore, in the prior art, in a case where the aforementioned terminal 9 is installed on the circuit board 1K, a problem arises in that no self-alignment effect is obtained and therefore the positional accuracy of the terminal 9 declines.

Conventionally, as means for raising the positional accuracy of the terminal 9, pins for registering the location of the terminal 9 may be constructed on the circuit board 1K. However, in the case of means of this kind, the aforementioned pins present an obstacle when installing the terminal 9 on the aforementioned circuit board 1K, and there have been instances where automatic installation of the terminal 9 by means of an automatic mounting device has been difficult to implement. Moreover, problems have also arisen in that the task of constructing the aforementioned pins on the circuit board 1K is complicated and the associated work cost becomes high.

DISCLOSURE OF THE INVENTION

It is an object of the present invention to provide a method for installing terminals on a circuit board, whereby the aforementioned problems can be resolved or alleviated. Moreover, it is a further object of the present invention to provide a circuit board on which the aforementioned method can be implemented appropriately.

A first aspect of the present invention is a method for installing terminals on a circuit board comprising a coating step for coating solder paste onto a desired circuit board, a superimposing step for superimposing a connecting end of a terminal also having a non-connecting end onto a region where the solder paste is coated, and a heating step for heating and melting the solder paste in order to solder the connecting end to the circuit board, characterized in that it comprises a step for coating an adhesive material on to the aforementioned circuit board, the connecting end being brought into contact with the region onto which the adhesive material has been coated in the superimposing step, and the solder paste being heated and caused to melt in a state where the connecting end is bonded to the circuit board by means of the adhesive material in the heating step.

A second aspect of the present invention is a circuit board whereon solder paste is coated for soldering a connecting end of a terminal also having a non-connecting end, characterized in that it is coated with an adhesive material, which contacts the connecting end when the connecting end is superimposed on the regions on which the solder paste is coated.

Desirably, the adhesive material is a thermosetting adhesive material which undergoes thermosetting at a lower temperature than the melting temperature of the solder paste, and in the heating step, the adhesive material undergoes thermosetting before the solder paste becomes molten.

Desirably, the adhesive material is coated onto the periphery of the solder paste coated regions, and in the superimposing step, the terminal is positioned in such a manner that the regions on which the adhesive material is coated make contact with the outer edges of the connecting end and project beyond the connecting end.

Desirably, in the superimposing step, by superimposing the whole of the terminal on the circuit board and then, after soldering of the connecting end has been completed, cutting the circuit board in the lateral direction of the terminal between the connecting end and non-connecting end, the non-connecting end is caused to project beyond the cut edge of the circuit board.

A third aspect of the present invention is a method for installing terminals on a circuit board comprising a coating step for coating solder paste onto a desired circuit board, a superimposing step for superimposing a connecting end of a terminal also having a non-connecting end onto a region where the solder paste is coated, and a heating step for heating and melting the solder paste in order to solder the connecting end to the circuit board, characterized in that an inserting section is provided in the circuit board; in the superimposing step, the terminal is fixed by inserting at least one portion of the terminal into the inserting section; and in the heating step, the solder paste is heated and caused to melt whilst the terminal is fixed by the inserting section.

A fourth aspect of the present invention is a circuit board whereon solder paste is coated for soldering a connecting end of a terminal also having a non-connecting end, characterized in that it comprises an inserting section into which at least a portion of the terminal can be inserted in such a manner that the positioning of the terminal is maintained when the connecting end is superimposed on the regions onto which the solder paste is coated.

Desirably, the inserting section is a recess section, wherein one portion of the circuit board is formed into a recessed shape by press processing.

Desirably, the inserting section is a recess section, wherein one portion of the circuit board is formed into a recessed shape by etching.

Desirably, the inserting section is a frame section formed by conducting thick film printing in a frame shape onto the circuit board.

A fifth aspect of the present invention is a method for installing terminals on a circuit board comprising: a coating step for coating solder paste onto one side of a desired circuit board; a superimposing step for superimposing a connecting end of a terminal also having a non-connecting end on the regions onto which the solder paste is coated, the terminal being made of a ferromagnetic material as a principal component; and a heating step for heating and melting the solder paste in order to solder the connecting end to the circuit board; characterized in that the method further comprises a step for positioning a magnet such that it confronts the opposite side of the circuit board to the one side thereof; in the superimposing step, the terminal is fixed by the magnetic force of the magnet when the connecting end is superimposed on the solder paste coated regions; and in the heating step, the solder paste is heated and caused to melt whilst the terminal is fixed by means of the magnetic force.

The various features and advantages of the present invention shall become apparent by means of the embodiments described hereinafter with reference to the accompanying drawings.

BRIEF DESCRIPTION OF THE DRAWINGS

FIG. 12b is an enlarged sectional view along line X2—X2 in FIG. 12a;

FIG. 16b is a sectional view along line X3—X3 in FIG. 16a;

FIG. 18b is a sectional view along line X4—X4 in FIG. 18a;

FIG. 19b is a sectional view along line X5—X5 in FIG. 19a;

FIG. 21b is a sectional view along line X6—X6 in FIG. 21a;

FIG. 22b is a sectional view along line X7—X7 in FIG. 22a;

FIG. 24b is a sectional view along line X8—X8 in FIG. 24a;

FIG. 26b is a sectional view along line X9—X9 in FIG. 26a;

BEST MODE FOR CARRYING OUT THE INVENTION

Below, preferred embodiments of the present invention are described with reference to the drawings.

Initially, a first embodiment of the present invention will be described with reference to FIG. 1 to FIG. 7.

Figure 1:
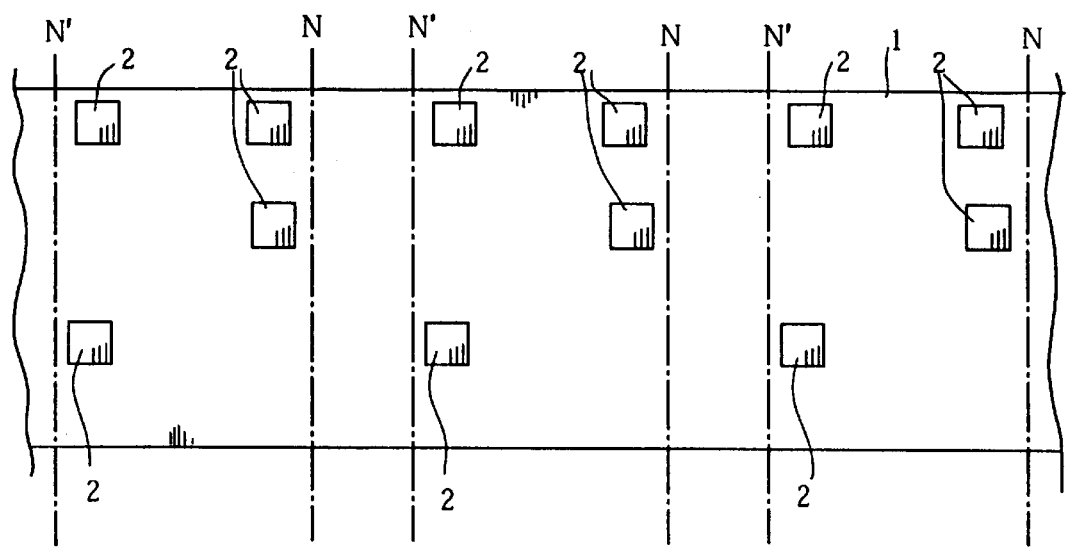
FIG. 1 is a principal plan view showing one example of a printed circuit board to which the present invention is applied.

This embodiment is described by adopting as an example a case where an electronic circuit device for protecting a rechargeable cell is manufactured using a printed circuit board 1 as illustrated in FIG. 1.

This printed circuit board 1 is made from glass epoxy resin, for example, and a plurality of pad regions 2 made from copper foil are provided on the surface thereof. Each of these pad regions 2 is approximately square shaped in plan view. Although not shown in the drawings, a plurality of electrically conductive wiring patterns connected to the aforementioned plurality of pad regions 2 is formed on the surface of the aforementioned printed circuit board 1, and a protective circuit for a rechargeable cell can be fabricated by installing prescribed electronic components on the printed circuit board 1. The printed circuit board 1 has shape which extends for a long distance in the horizontal direction in FIG. 1. In principle, the aforementioned plurality of conductive wiring patterns and the aforementioned plurality of pad regions 2 are provided in the longitudinal direction of the printed circuit board 1. The imaginary lines N, N' shown in FIG. 1 indicate locations for cutting the printed circuit board 1 in such a manner that a plurality of protective circuits for a rechargeable cell fabricated on the aforementioned printed circuit board 1 are separated into individual protective circuits.

Figure 2:
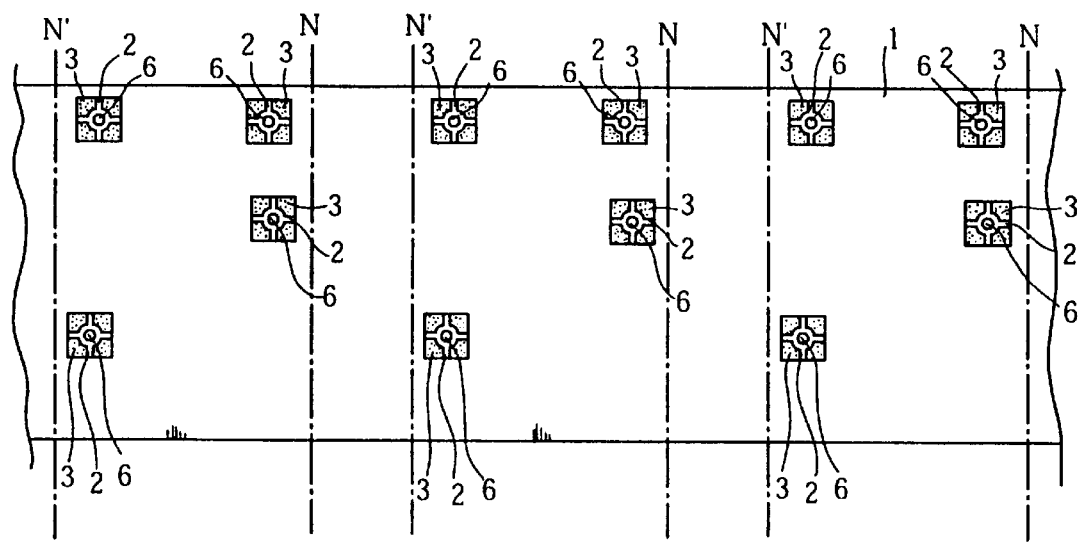
FIG. 2 is a principal plan view showing one example of a step for coating solder paste and an adhesive material onto the printed circuit board shown in FIG. 1.
Figure 3:
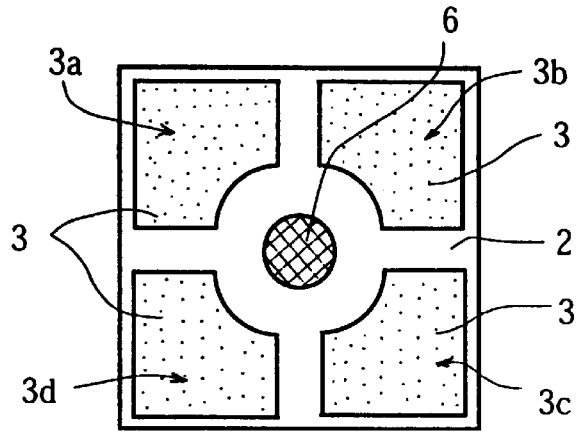
FIG. 3 is a principal enlarged plan view of FIG. 2.

In order to manufacture the aforementioned electronic circuit device, firstly, solder paste 3 and an adhesive material 6 are coated onto each of the aforementioned pad regions 2, as shown in FIG. 2. This process of coating solder paste 3 can be carried out by screen printing. Furthermore, as illustrated in FIG. 3, the solder paste 3 is coated in such a manner that it is divided into a total of four regions 3a–3d, for example. The operation of coating solder paste 3 can be carried out simultaneously with the operation of coating solder paste in order to solder prescribed components constituting the aforementioned protective circuits onto other locations on the printed circuit board 1.

The aforementioned adhesive material 6 can be coated on using an adhesive coating device (omitted from drawings) of a type which extrudes adhesive from a nozzle. Therefore, the operation of coating the aforementioned adhesive material 6 can be carried out with good efficiency at the same time as the operation of coating the aforementioned solder paste, and hence work efficiency is notably superior when compared to a conventional operation wherein location-registering pins are constructed on the circuit board. As illustrated in FIG. 3, the adhesive material 6 is coated in such a manner that is located in an approximately central position with respect to the aforementioned regions 3a–3d, for example. The adhesive material 6 is a thermosetting adhesive, and it sets at a lower temperature (for example, 150-C) than the melting temperature of the solder paste 3 (for example, 220-C).

Figure 4:
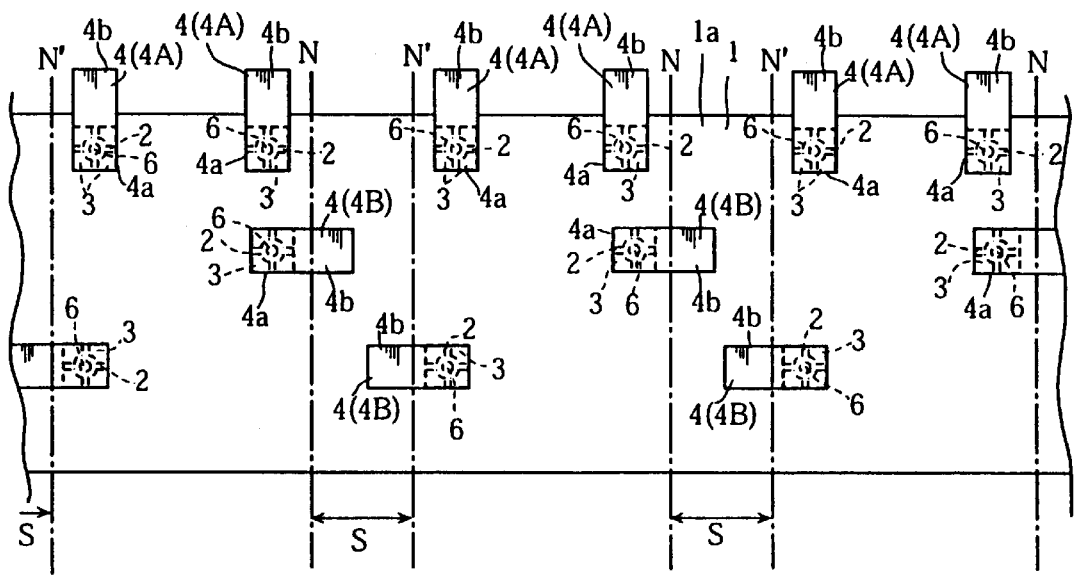
FIG. 4 is a principal plan view showing one example of a state where terminals are installed on a printed circuit board.
Figure 5:
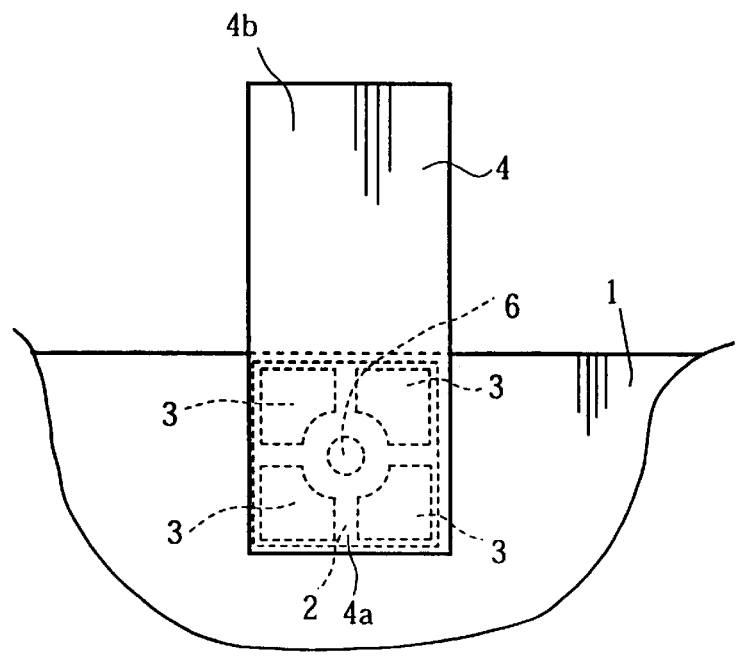
FIG. 5 is a principal enlarged plan view of FIG. 4.

After the aforementioned operations have been completed, a plurality of terminals (4A, 4B) is mounted on the printed circuit board 1, as illustrated in FIG. 4 and FIG. 5. Thereby, the connecting ends 4a of each terminal 4 are superimposed on the regions coated with solder paste 3 and the regions coated with adhesive material 6. A thin metal plate made from nickel, for example, is used for the aforementioned terminals 4. In the present embodiment, as described hereinafter, soldering can be conducted without displacing the position of each terminal 4 with respect to the printed circuit board 1, and there is no need to provide pins for registering the position of the terminals 4 on the printed circuit board 1. Consequently, on the printed circuit board 1 there is no obstacle which may impede the mounting of the terminals 4 onto the printed circuit board 1, and hence the task of mounting the terminals 4 onto the printed circuit board 1 can be carried out with good efficiency using a general chip mounting device as used to mount chip-shaped electronic components onto any type of printed circuit board.

In a case where a portion of the aforementioned plurality of terminals 4 (4A) are located in side edge portions 1a of the aforementioned printed circuit board 1 extending in the longitudinal direction thereof, the corresponding non-connecting ends 4b of these terminals assume an open-sided state, projecting beyond the aforementioned first side edge region 1a. When these terminals 4 (4A) are installed on the printed circuit board 1 by means of a chip mounting device, it is possible to press the aforementioned terminals 4 (4A) onto the solder paste 3 coated regions and the adhesive 6 coated regions, causing them to adhere thereto, using a uniform pressure. Consequently, as result of the fact that the terminals 4 (4A) are in an open-sided state, it is possible to prevent these terminals 4 (4A) from becoming detached from the printed circuit board 1. On the other hand, the remaining terminals 4 (4B) have their respective non-connecting ends 4b located in the narrow regions S between the aforementioned imaginary lines N, N'. This task of installing terminals can be carried out with good efficiency in combination with the task of mounting prescribed electronic components which constitute the aforementioned protective circuits on the printed circuit board 1 by means of a chip mounting device.

Once the aforementioned tasks have been completed, the printed circuit board 1 is heated by being passed through a solder reflowing furnace. During the heating process, firstly, the adhesive material 6 undergoes thermal setting, and the terminals 4 become securely bonded and fixed to the printed circuit board 1. The solder paste 3 becomes molten after the thermosetting of the adhesive material 6. Therefore, even if no self-alignment effect is displayed when the solder paste 3 becomes molten, the aforementioned terminals 4 will be soldered to the printed circuit board 1 in a state where they are fixed in the initial prescribed positions at which they were mounted by the chip mounting device. As a result, it is possible to raise the positional accuracy of the aforementioned terminals 4. Moreover, since the thermosetting process for the adhesive material 6 and the heating and melting process for the solder paste 3 can be carried out in a single heating step, the overall number of task steps is reduced. The soldering of the terminals 4 is completed when the solder paste 3 cools and hardens.

Figure 6:
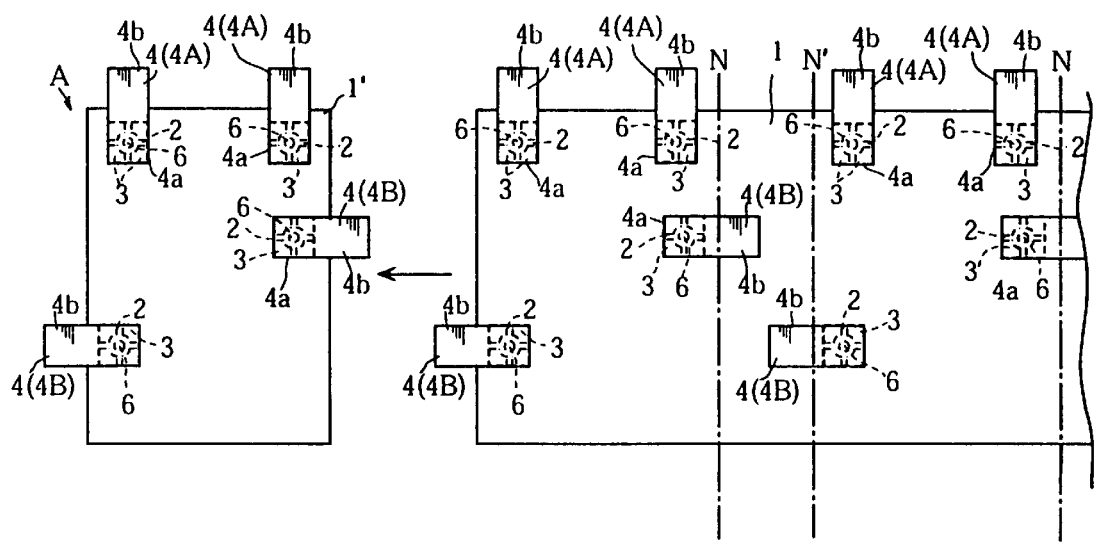
FIG. 6 is a principal plan view showing one example of a step for cutting a printed circuit board.

When the sequence of tasks described above has been completed, the printed circuit board 1 is cut at the positions indicated by the aforementioned imaginary lines N, N', as illustrated in FIG. 6. Thereby, a plurality of electronic circuit devices A can be obtained. Each of the aforementioned electronic devices A has a structure wherein the aforementioned plurality of terminals 4 are soldered to a cut printed circuit board 1', whilst the non-connecting ends 4b of these terminals project beyond the printed circuit board 1'.

Figure 7:
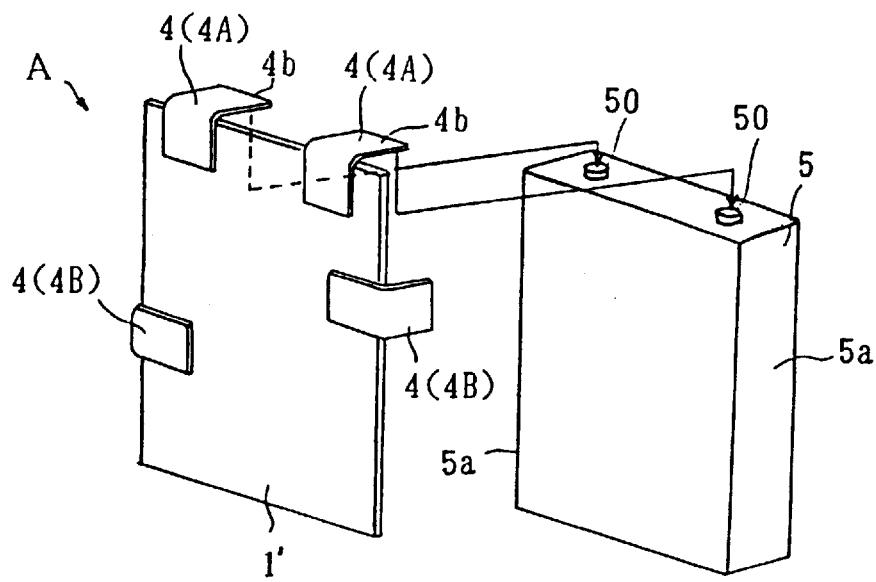
FIG. 7 is an oblique view showing one applicational example of an electronic circuit device manufactured by installing terminals on a printed circuit board.

The aforementioned electronic circuit devices A can be used by bending the non-connecting ends 4b of each terminal 4, as shown in FIG. 7, for example. More specifically, two of the terminals 4A can be brought into contact with two electrodes 50 of a rechargeable cell 5 and spot welded thereto. Furthermore, the two terminals 4B can be made to run along either side face 5a, 5a of the aforementioned rechargeable cell 5, in such a manner that the aforementioned rechargeable cell 5 is positioned therebetween. The two terminals 4B can be used, for example, to make an electrical connection with prescribed electronic circuits incorporated in the main unit of a portable telephone onto which the aforementioned rechargeable cell 5 is fitted, or the like. As stated previously, since the aforementioned terminals 4 are each soldered securely to prescribed positions on the printed circuit board 1, due to the effect of positional fixing by means of the adhesive material 6, it is possible to form electrical connections accurately between the terminals 4 and prescribed locations on the rechargeable cell 5.

Figure 8A:
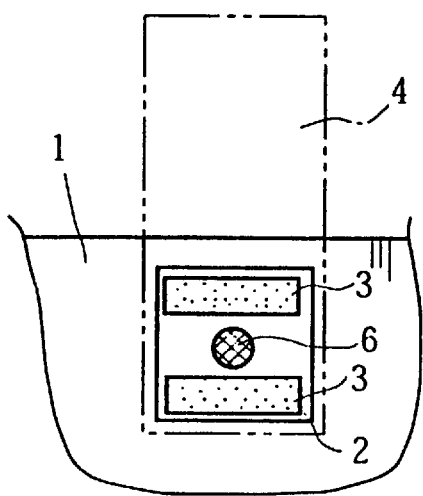
FIG. 8a and FIG. 8b are principal plan views showing other examples of a step for coating solder paste and an adhesive material.
Figure 8B:
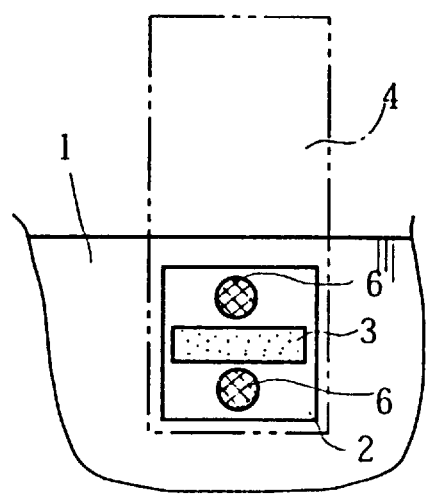

The present invention is not limited to the embodiment described above in terms of the actual positioning of the regions coated with solder paste. In the present invention, the shape, surface area and configuration pattern of the solder paste 3 and adhesive material 6 coated onto the printed circuit board 1 can be altered variously as illustrated in FIG. 8a and FIG. 8b, for example. In any case, there should be provided at least one region coated with solder paste 3 and one region coated with adhesive material 6.

Next, a second embodiment of the present invention will be described with reference to FIG. 9a and FIG. 10.

Figure 9A:
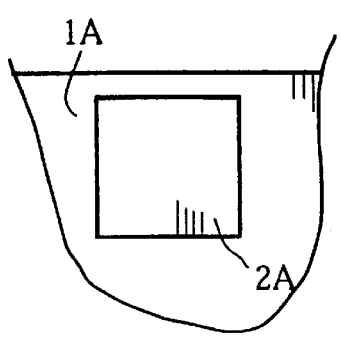
FIG. 9a–FIG. 9c are principal plan views showing a further example of a sequence of steps in a method for installing terminals on a circuit board relating to the present invention.
Figure 9B:
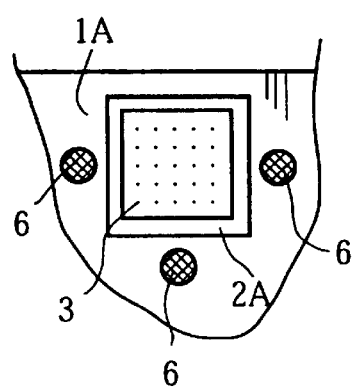
Figure 9C:
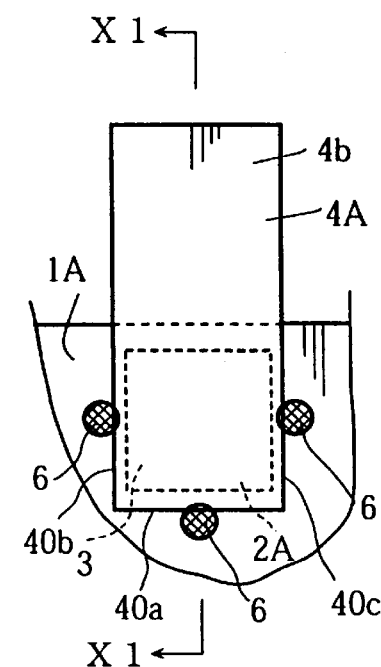
Figure 10:
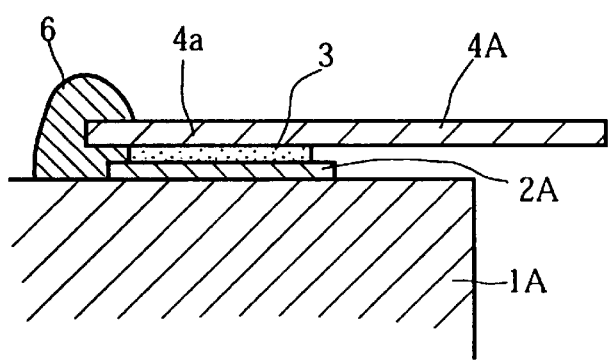
FIG. 10 is a sectional view along line X1—X1 in FIG. 9c.

In the present embodiment, as shown in FIG. 9a, a printed circuit board 1A provided with a pad region 2A made from copper foil is used. Firstly, as shown in FIG. 9b, in addition to coating solder paste 3 onto the surface of the aforementioned pad region 2A, an adhesive material 6 is coated onto a plurality of separate regions in the peripheral area of these pad region 2A. Thereupon, as illustrated in FIG. 9c, a terminal 4A is installed on the printed circuit board 1A by means of a chip mounting device, its connecting end 4a being superimposed on the region where the aforementioned solder paste 3 is coated. In this operation, the terminal 4A is positioned in such a manner that the regions of the aforementioned adhesive material 6 each contact the respective outer edges 40a–40c of the aforementioned connecting end 4a, whilst the majority of the regions onto which the adhesive material 6 is coated extend outside the aforementioned terminal 4A. By adopting this composition, it is possible to obtain a state where the adhesive material 6 does not accumulate to a large thickness underneath the terminal 4A.

After the tasks described above have been completed, the printed circuit board 1A is heated by passing it through a solder reflow furnace. In this heating process, similarly to the first embodiment described above, the terminal 4A is fixed securely to the aforementioned printed circuit board 1A by means of the adhesive material 6 ur ergoing thermosetting, whereupon it is soldered thereto by means of the aforementioned solder paste 3 becoming molten. Therefore, the aforementioned terminal 4A can be soldered reliably to a prescribed position. Moreover, since the aforementioned adhesive material 6 does not accumulate to a large thickness underneath the terminal 4A, it is possible to prevent the aforementioned connecting end 4a from being raised up significantly above the aforementioned solder paste 3, even if the adhesive material 6 sells in volume during its thermosetting process. Therefore, the task of soldering the aforementioned connecting end 4a can be carried out more reliably. Moreover, since it does not matter if too much of the adhesive material 6 is coated onto the board, control of the amount of adhesive material 6 becomes simple to implement.

Figure 11:
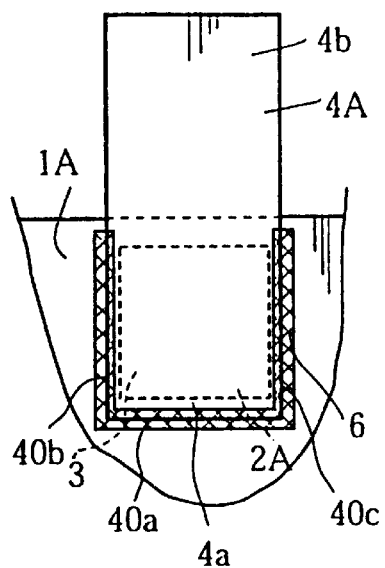
FIG. 11 is a principal plan view showing a further example of a step for coating an adhesive material onto a circuit board.

The present invention is not limited to the embodiment described above in terms of the pattern of coating adhesive material, even in cases where the adhesive material is provided in such a manner that it projects beyond the connecting end of the terminal. In the present invention, the aforementioned adhesive material 6 may be coated in a linear shape, as illustrated in FIG. 11, for example, in such a manner that the adhesive material 6 contacts linearly a total of three respective outer edges 40a–40c of the connecting end 4a of a terminal 4A.

Next, a third embodiment of the present invention is described with reference to FIG. 12a–FIG. 16b.

Figure 12A:
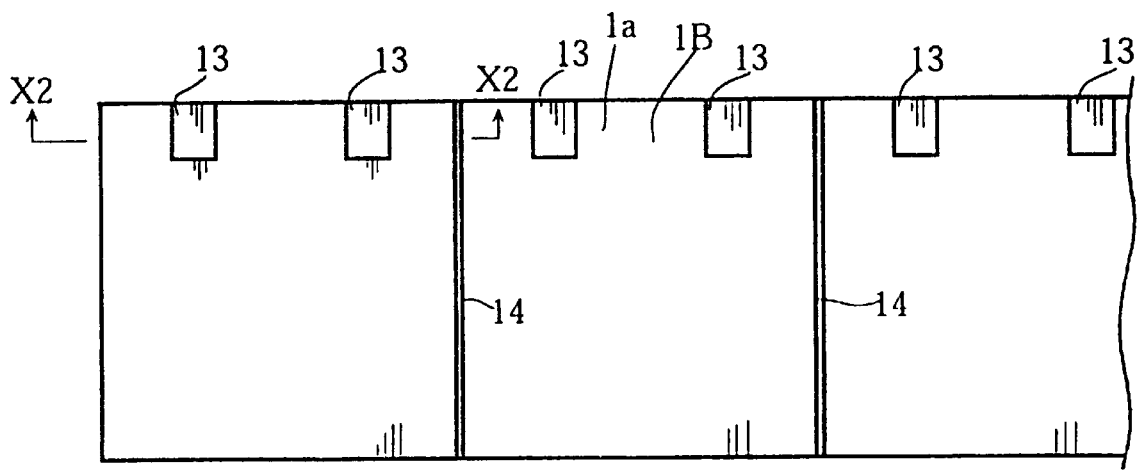
FIG. 12a is a principal plan view showing a further example of a printed circuit board to which the present invention is applied.
Figure 12B:
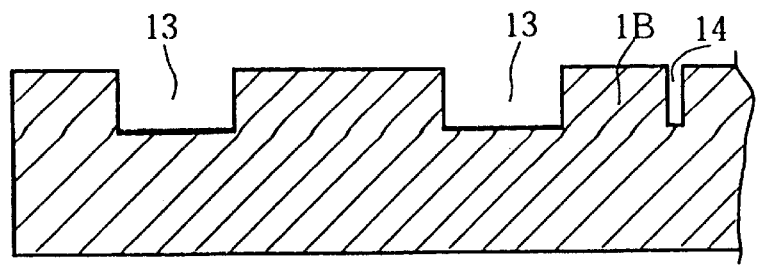

In the present embodiment, the printed circuit board 1B illustrated in FIG. 12a and FIG. 12b is used. A plurality of recess sections 13 having an approximately square shape in plan view are provided on the surface of a side edge region 1a of the aforementioned printed circuit board 1B, extending in the longitudinal direction thereof. Furthermore, cutting lines are provided at a plurality of stages for the purpose of cutting the printed circuit board 1B into a plurality of circuit boards. Each cutting line 14 has a grooved shape running in the lateral direction of the printed circuit board 1B, and is formed by pressing. The aforementioned recess sections 13 are formed by pressing, simultaneously with the step of pressing to form the aforementioned cutting lines 14. In this way, if the aforementioned recess sections 13 and the aforementioned cutting lines 14 are formed by means of a single pressing process, the corresponding forming tasks become simple to implement.

Figure 13:
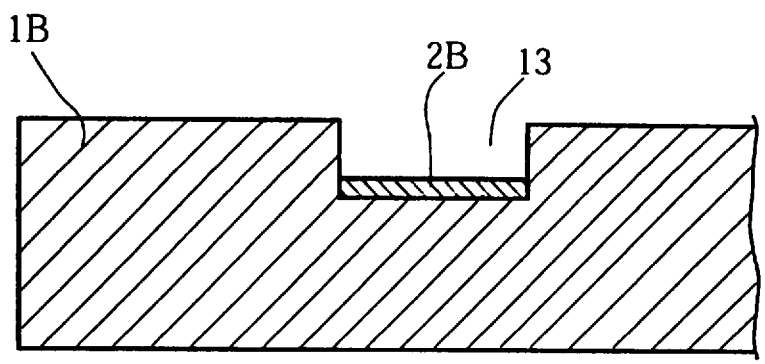
FIG. 13 is a principal sectional view illustrating a step for forming a pad region on a printed circuit board.
Figure 14:
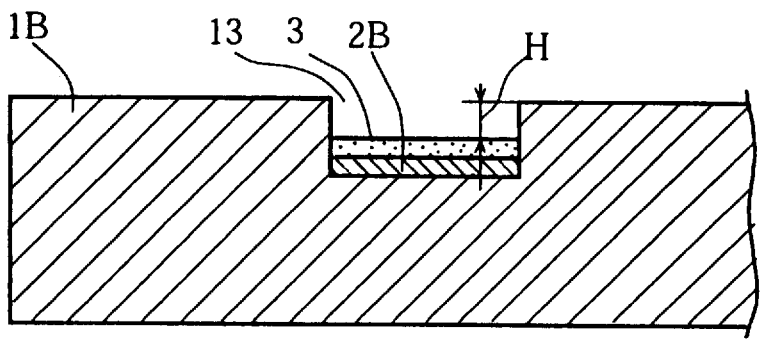
FIG. 14 is a principal sectional view illustrating a step for coating solder paste.

In the present embodiment, firstly, copper foil is attached to the lower face of each recess section 13 to form a pad region 2B, as illustrated in FIG. 13. This pad region 2B may be provided across the whole of the lower face of the recess section 13, but it is not limited to this and may also be provided in a partial manner. Once the tasks described above have been completed, solder paste 3 is coated onto the surface of the aforementioned pad region 2B, as shown in FIG. 14. This process is designed such that the recess section 13 is not filled by the aforementioned solder paste 3, but rather the surface of the solder paste 3 coated region is lower than the surface of the printed circuit board 1B by a suitable dimension H.

Figure 15:
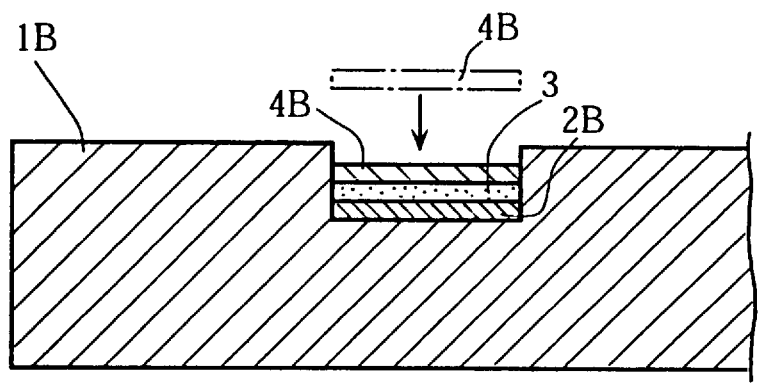
FIG. 15 is a principal sectional view a step for installing terminals on a printed circuit board.
Figure 16A:
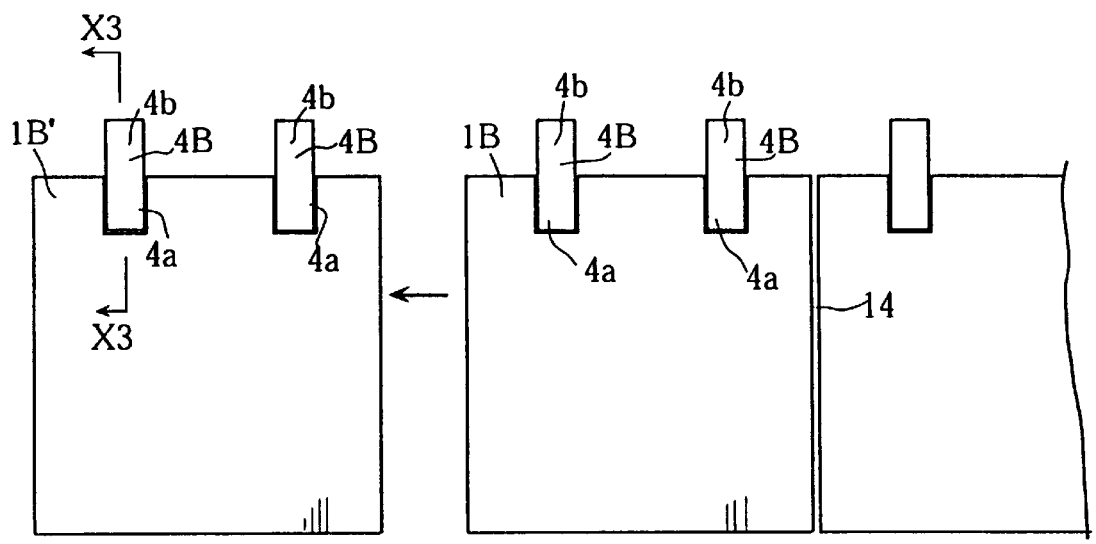
FIG. 16a is a principal plan view showing a step for cutting a printed circuit board whereon terminals have been installed.
Figure 16B:
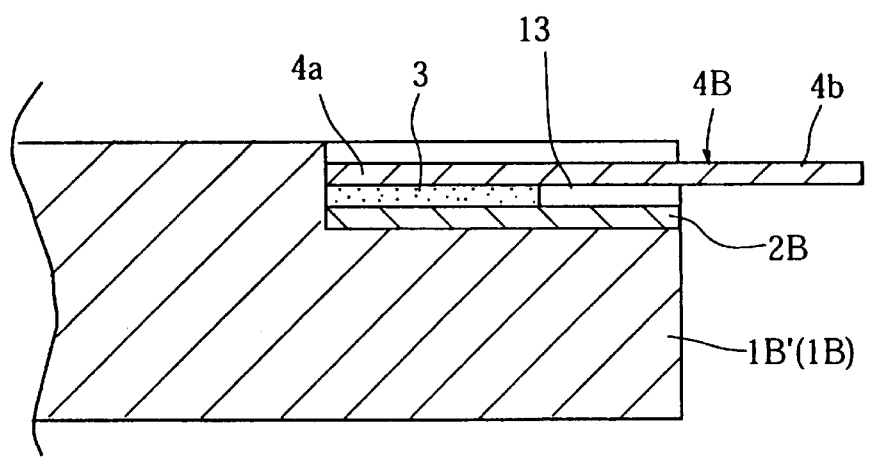

Thereupon, as illustrated in FIG. 15, terminal 4B is placed into the recess section 13. In this case, as shown in FIG. 16b, only the connecting end 4a of the terminal 4b is placed into the recess section 13. Thereby, it is possible to create a contact between the connecting end 4a and the region coated with solder paste 3, whilst also fixing the whole of the terminal 4B in position with respect to the printed circuit board 1B. The non-connecting end 4b of the terminal 4B projects beyond the printed circuit board 1B. No obstacles are present on the upper face of the printed circuit board 1B which may obstruct the process of placing the terminal 4B into the recess section 13. Therefore, the task of inserting the terminal 4B into the recess section 13 can be carried out with good efficiency using a chip mounting device, similarly to the embodiments described above.

Once the tasks described above have been completed, the printed circuit board 1B is heated by passing it through a reflow soldering furnace. Since the terminal 4B is fixed in position by the recess section 13, it is possible to solder the terminal 4B accurately to a prescribed position, without displacing the position of the terminal 4B when the solder paste 3 is molten. After completion of the aforementioned soldering process, the printed circuit board 1B is cut along the aforementioned cutting lines 14, as illustrated in FIG. 16a. Thereby, a plurality of printed circuit boards 1B', whereon a plurality of terminals 4B are mounted, is obtained. The non-connecting ends 4b of each of the terminals 4B project outside the printed circuit board 1B', and therefore these non-connecting ends 4b can be bent in a similar manner to the case of the electronic circuit device A illustrated in FIG. 7.

Figure 17A:
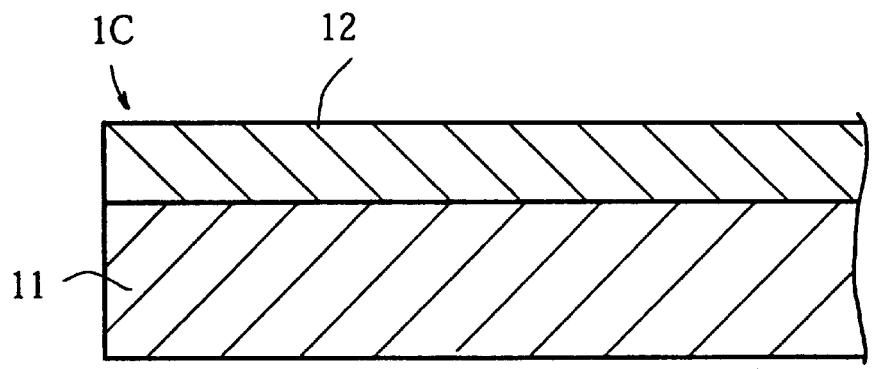
FIG. 17a to FIG. 17c are principal sectional views showing a further example of a sequence of steps in a method for installing terminals on a circuit board relating to the present invention.
Figure 17B:
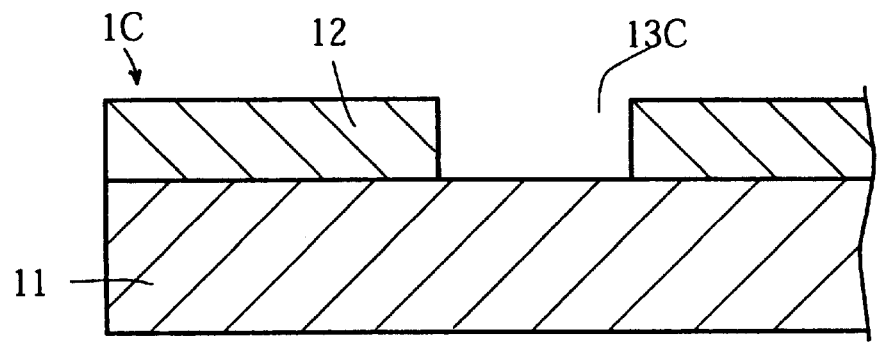
Figure 17C:
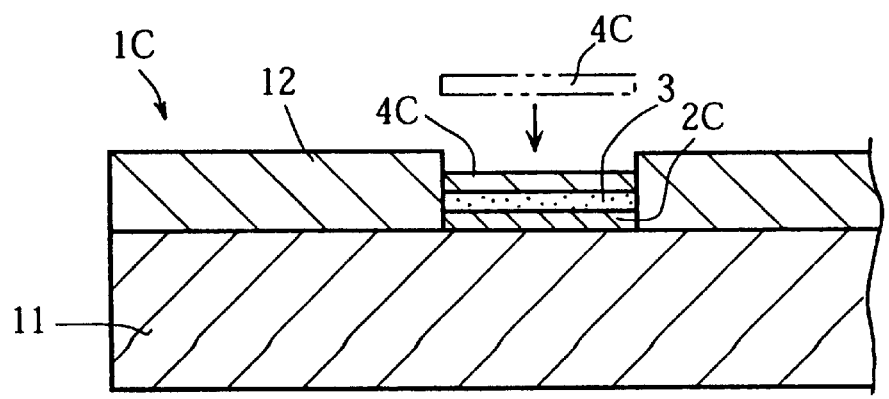

The present invention is not limited to using a pressing process as a method for forming recess sections in the printed circuit board. In the present invention, means as illustrated in FIG. 17a to FIG. 17c, for example, may also be used for this purpose. Namely, the printed circuit board 1C shown in FIG. 17a comprises a photoresist layer 12 of uniform thickness formed onto the surface of a substrate main body 11. When the printed circuit board 1C is used, a recess section 13C of uniform width and uniform depth can be formed in the surface portion of the printed circuit board 1C by carrying out etching of the aforementioned photoresist layer 12. Similarly to a general photo-etching process, this etching process is carried out by conducting an exposure process using a photomask and a corresponding developing process, followed by a step wherein the printed circuit board 1C is immersed in an etching processing solution. After forming the recess section 13C, a step for providing a pad region 2C on the lower face of the recess section 13C is implemented, followed by a step for coating solder paste 3 onto the pad region 2C and a step for inserting a terminal 4C into the recess section 13C, whereupon the solder paste 3 should be heated and caused to melt.

Next, a fourth embodiment of the present invention is described with reference to FIG. 18a–FIG. 20.

Figure 18A:
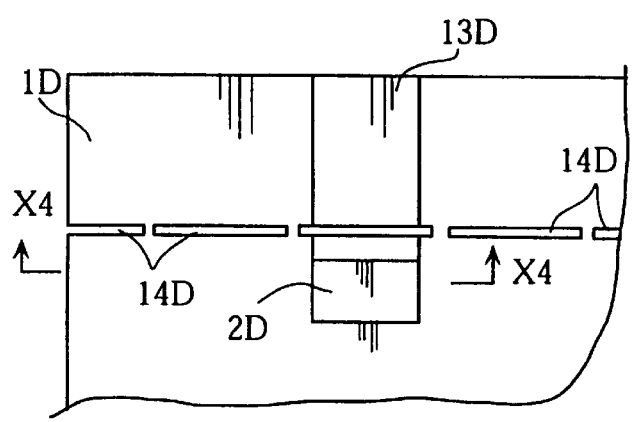
FIG. 18a is a principal plan view showing a further example of a printed circuit board to which the present invention is applied.
Figure 18B:
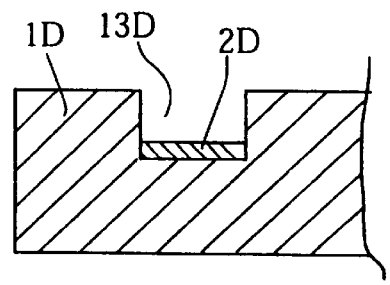

In the present embodiment, the printed circuit board 1D illustrated in FIG. 18a and FIG. 18b is used. In this printed circuit board 1D, in addition to providing recess sections 13D in the surface of the circuit board, cutting lines 14D intersecting laterally with these recess section 13D are also provided. The cutting lines 14D are used for cutting the aforementioned printed circuit board 1D in the manner described hereinafter in relation to FIG. 20. These cutting lines 14D are formed at intermittent slits, but it is also possible to adopt a composition where, instead of this form, a cutting line in the shape of a continuous groove is provided. The aforementioned cutting lines 14D and the aforementioned recess section 13D can be formed simultaneously by means of pressing. A pad region 2D is provided at one end portion of the lower face of each recess section 13D.

Figure 19A:
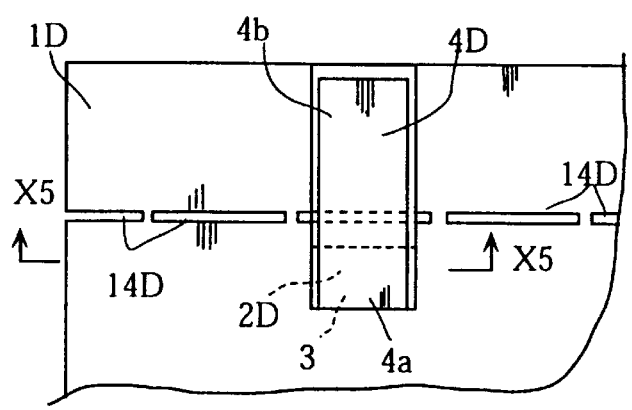
FIG. 19a is a principal plan view showing a state where terminals have been installed on the printed circuit board illustrated in FIG. 18a and 18b.
Figure 19B:
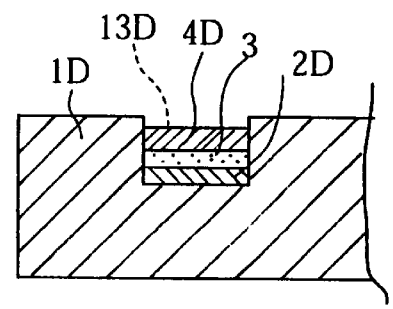

In order to install a terminal 4D on the aforementioned printed circuit board 1D, as illustrated in FIG. 19a and FIG. 19b, firstly, solder paste 3 is coated onto the surface of the aforementioned pad region 2D, whereupon the whole of the terminal 4D is inserted into the recess section 13D by means of a chip mounting device. Consequently, terminals can be registered in position more reliably than in cases where only a portion of a terminal is inserted. As a result of this, it is possible to raise yet further the positional accuracy of the terminal 4D when it is subsequently soldered to the printed circuit board 1D by heating and melting the solder paste 3.

Figure 20:
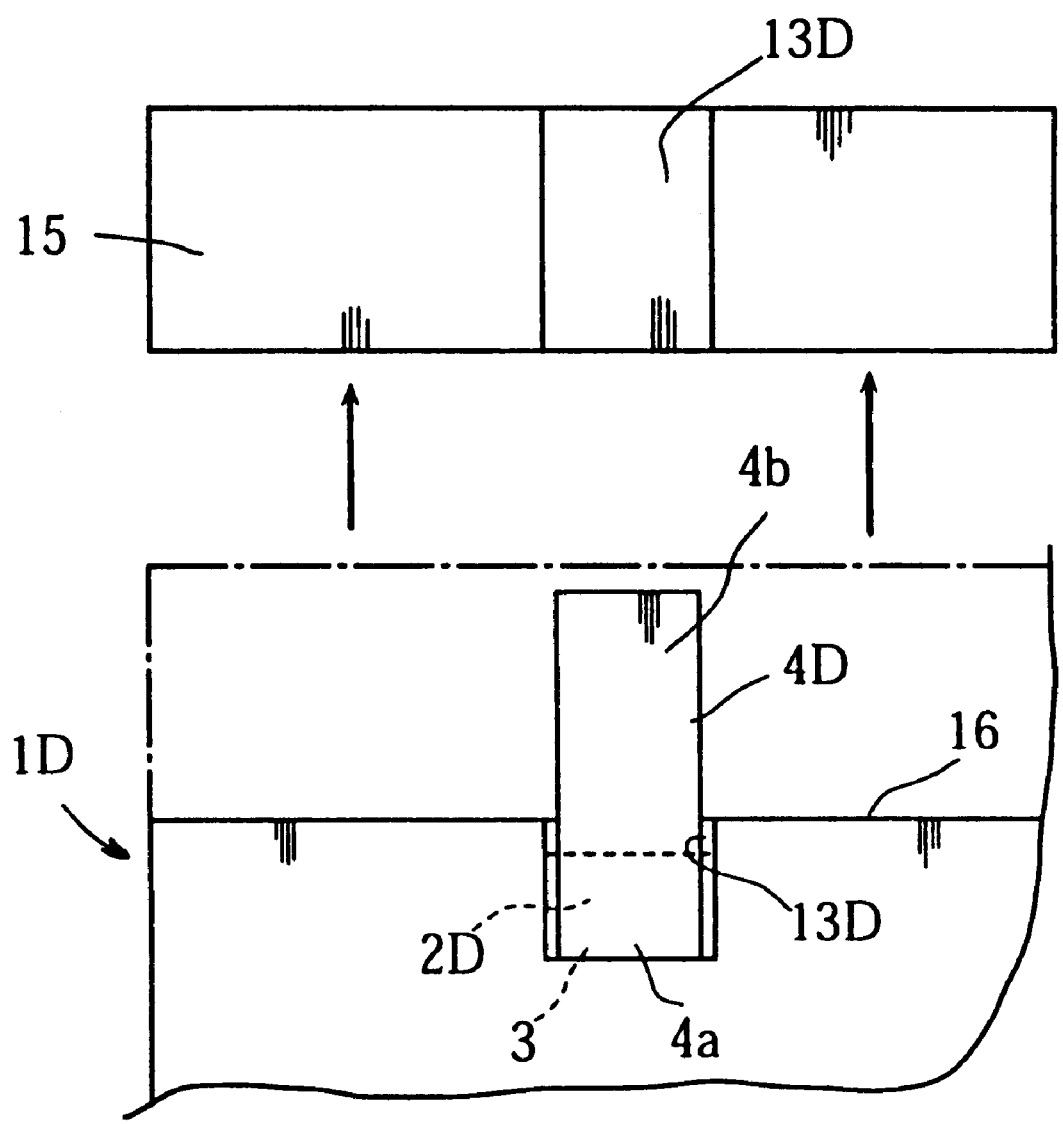
FIG. 20 is a principal plan view showing a state where a printed circuit board whereon soldering of terminals has been completed is cut.

Once the task of soldering the terminals 4D has been completed, the printed circuit board 1D is cut along the aforementioned cutting line 14D, as shown in FIG. 20, thereby separating off the side edge region 15 of the printed circuit board 1D. No solder paste 3 is coated onto the side edge region 15, so the terminals 4D are not soldered thereto. Therefore, the task of separating the side edge region 15 can be carried out readily. If the printed circuit board 1D described above is cut in this way, it is possible to cause the non-connecting ends 4b of the terminals 4D to project beyond the cutting edge 16. Consequently, a printed circuit board is obtained wherein the terminals are mounted in such a manner than they can be bent into shape according to requirements.

Next, a fifth embodiment of the present invention will be described with reference to FIG. 21a–FIG. 23.

Figure 21A:
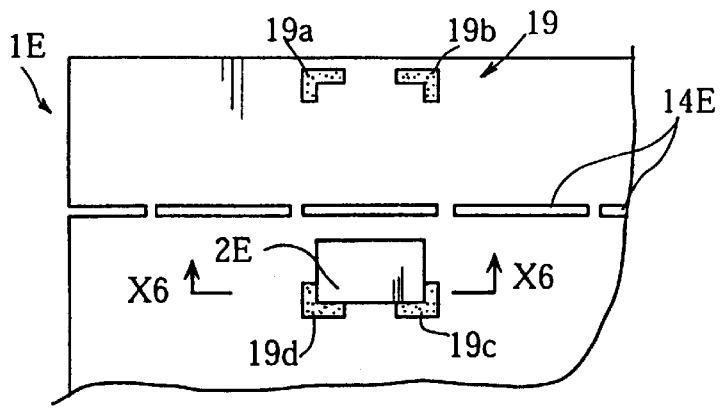
FIG. 21a is a principal plan view showing a further example of a printed circuit board to which the present invention is applied.
Figure 21B:
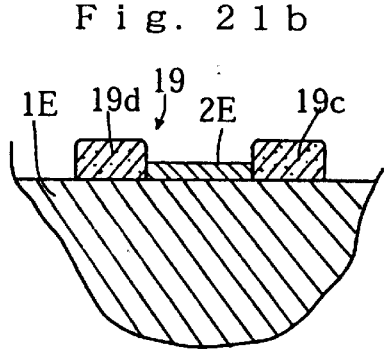

In the present embodiment, the printed circuit board 1E shown in FIG. 21a and 21b is used. A frame section 19 is provided on the surface of this printed circuit board 1E. This frame section 19 comprises a total of four L-shaped printed areas 19a–19d, when observed in plan view, which are formed by printing a thick film of a suitable ink (paint) onto the printed circuit board 1E by screen printing. A cutting line 14E which intersects laterally with the frame section 19 is provided on the printed circuit board 1E. A pad region 2E is provided inside the aforementioned frame section 19.

Figure 22A:
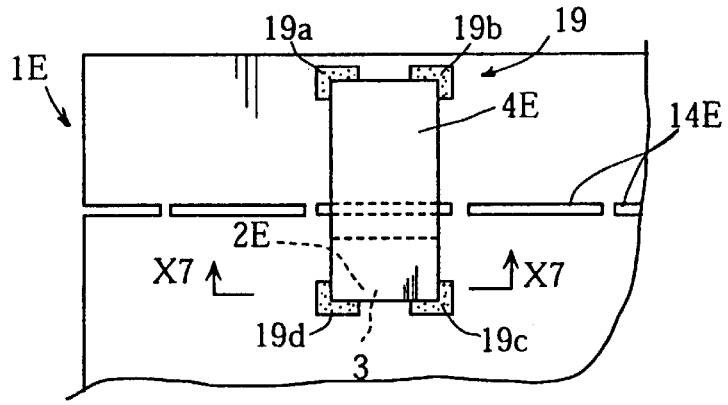
FIG. 22a is a principal plan view showing a state where a terminal is mounted on the printed circuit board illustrated in FIG. 21a and FIG. 21b.
Figure 22B:
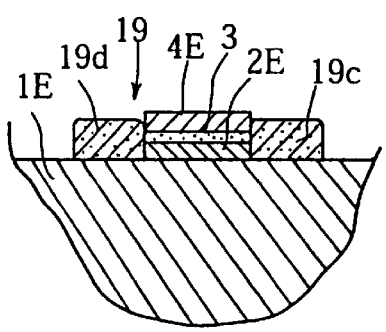
Figure 23:
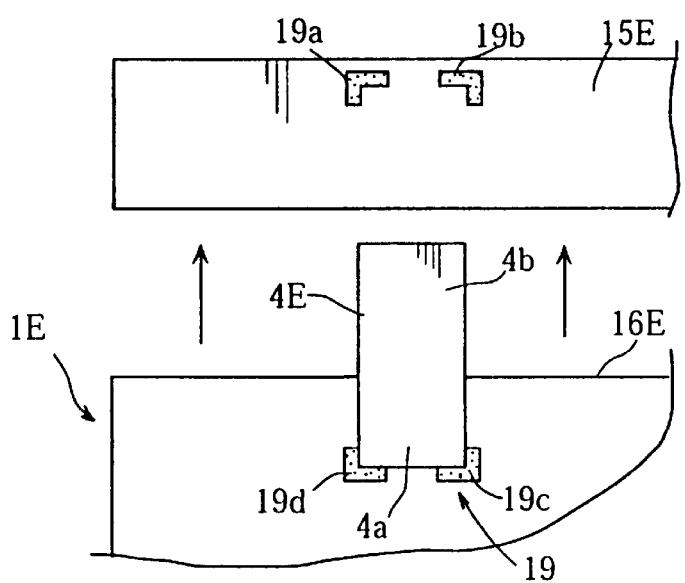
FIG. 23 is a principal plan view showing a state where a printed circuit board whereon soldering of terminals has been completed is cut.

As shown in FIG. 22a and FIG. 22b, solder paste 3 is coated onto the surface of the pad region 2E, whereupon the whole of the terminal 4E is inserted in the frame section 19. The frame section 19 projects above the surface of the printed circuit board 1E, but its thickness is extremely small. Therefore, the task of inserting the terminal 4E into the frame section 19 can also be carried out with good efficiency using a chip mounting device. Thereupon, the solder paste 3 is heated and caused to melt, but since the whole of the terminal 4E is fixed in position by means of the aforementioned frame section 19, inadvertent displacement of the terminal 4E is prevented.

After the soldering of the terminal 4E has been completed, the printed circuit board 1E is cut along the cutting line 14E, and the side edge region 15E of the printed circuit board 1E is separated. By so doing, the non-connecting ends 4b of the terminal 4E project beyond the cutting edge 16E of the printed circuit board 1E. Consequently, a printed circuit board is obtained on which terminals are mounted in such a manner that they can be bent to shape according to requirements.

Figure 24A:
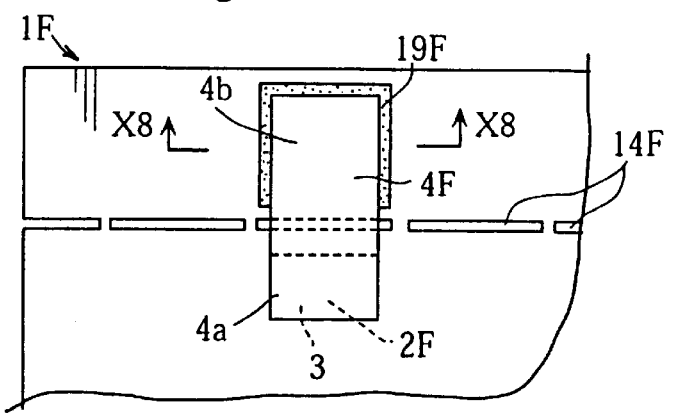
FIG. 24a is a principal plan view showing a further example of a frame section provided on a printed circuit board.
Figure 24B:
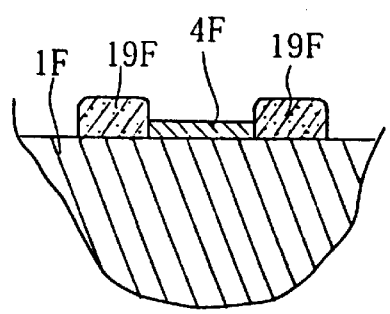
Figure 25:
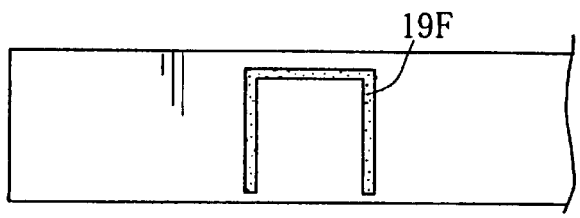
FIG. 25 is a principal plan view showing a state where the printed circuit board illustrated FIG. 24a and FIG. 24b is cut.
Figure 25:
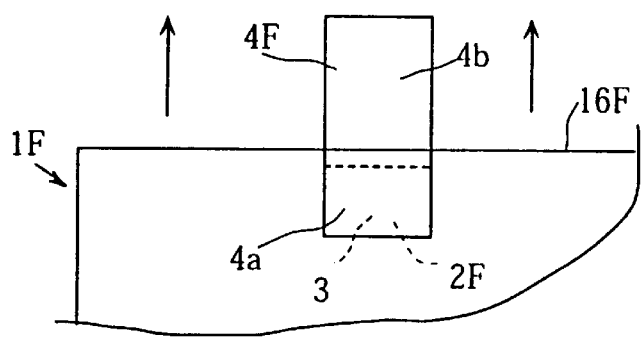

The actual composition of the frame section provided in the present invention is not limited to the embodiments described above, and the following means may also be used. Namely, a frame section 19F is provided on a printed circuit board 1F on one side of a cutting 14F, as illustrated in FIG. 24a and 24b, for example. This frame section 19F can be provided by thick film printing. Furthermore, a pad region 2F is provided on the other side of the aforementioned cutting line 14F and solder paste 3 is coated onto the surface thereof. The connecting end 4a of a terminal 4F is superimposed on the region coated with solder paste 3, in such a manner that the non-connecting end of the terminal 4F fits into the frame section 19 FIG. Even using means such as this, it is possible to fix the terminal 4F by means of the frame section 19F, and the aforementioned connecting end 4a can be soldered accurately to a prescribed position. When the task of soldering the aforementioned connecting end 4a has been completed, the printed circuit board 1F is cut along the cutting line 14F, as illustrated by FIG. 25. Thereby, the non-connecting end 4b of the terminal 4F is caused to project beyond the cutting edge 16F of the printed circuit board 1 FIG.

Figure 26A:
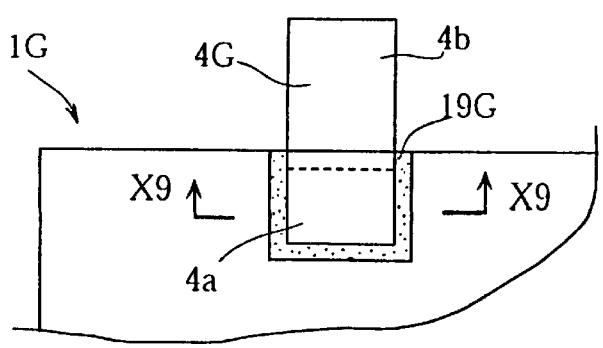
FIG. 26a is a principal plan view showing a further example of a frame section provided on a printed circuit board.
Figure 26B:
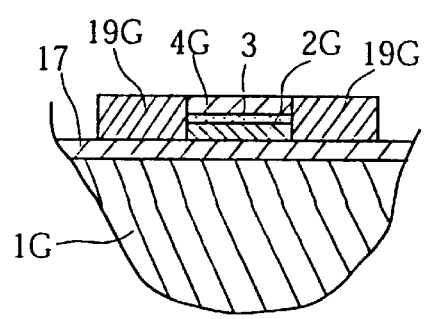

Moreover, in the present invention, it is also possible to use means as illustrated in FIG. 26a and FIG. 26b, for example, instead of the aforementioned means. This means comprises a frame section 19G provided on a printed circuit board 4G, into which only the connecting end 4a of a terminal 4G can be inserted. A pad region 2G is provided in the area surrounded by the frame section 19G, and solder paste 3 is coated on the surface thereof. Even using means such as this, it is possible to fix the terminal 4G to a prescribed position using the frame section 19G, thereby allowing positional accuracy to be increased. Moreover, the non-connecting end 4b of the terminal 4G can be set such that it projects beyond the printed circuit board 4G, when the connecting end 4a thereof is fitted into the frame section 19G. Consequently, it becomes unnecessary to cut the printed circuit board 1G after soldering the terminal 4G, as means for causing the non-connecting end 4b of the terminal 4G to project beyond the printed circuit board 4G, and therefore the total number of tasks can be reduced.

In the present invention, the frame section can also be provided using a method other than thick film printing. For example, it is common for a resist layer (position indicated by numeral 17 in FIG. 26b) to be provided on a printed circuit board in order to protect the surface thereof. Therefore, a frame section may be provided on the printed circuit board by coating an additional, thick resist layer of the same material onto this resist layer.

Figure 27A:
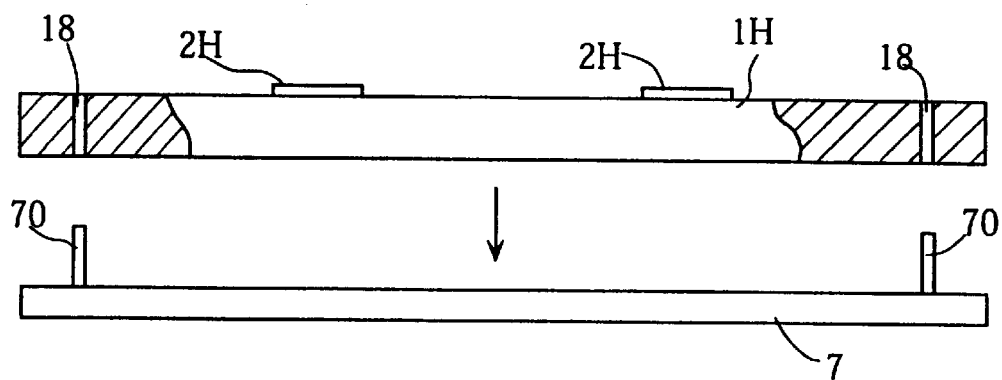
FIG. 27a–FIG. 27c are partial sectional side views showing a further example of a sequence of steps in a method for installing terminals on a circuit board relating to the present invention.
Figure 27B:
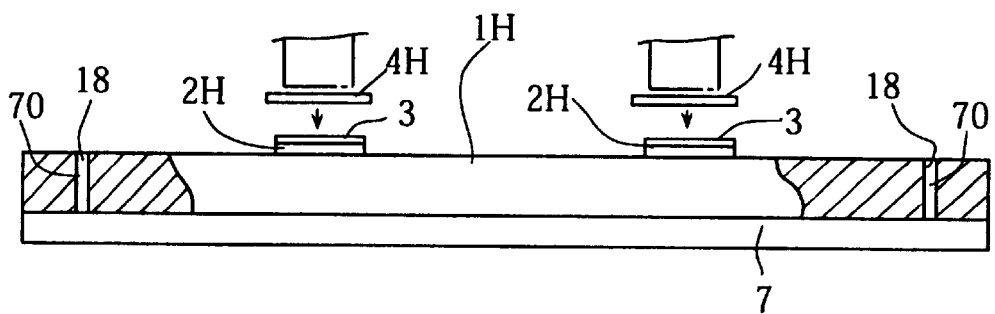

A sixth embodiment of the present invention is now described with reference to FIG. 27a–FIG. 27c.

In this embodiment, a printed circuit board 1H comprising pad regions 2H and holes 18 is mounted on a magnet 7. This magnet 7 has a planar shape and is of approximately the same size as the aforementioned printed circuit board 1H, and it comprises position-locating pins 70 which can be inserted through the aforementioned holes 18. By fitting the pins 70 into the holes 18, the printed circuit board 1H can be fixed over the magnet 7.

Figure 27C:
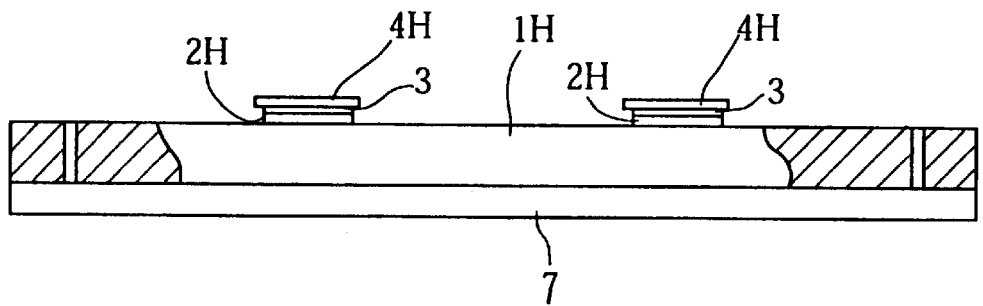
Figure 28:
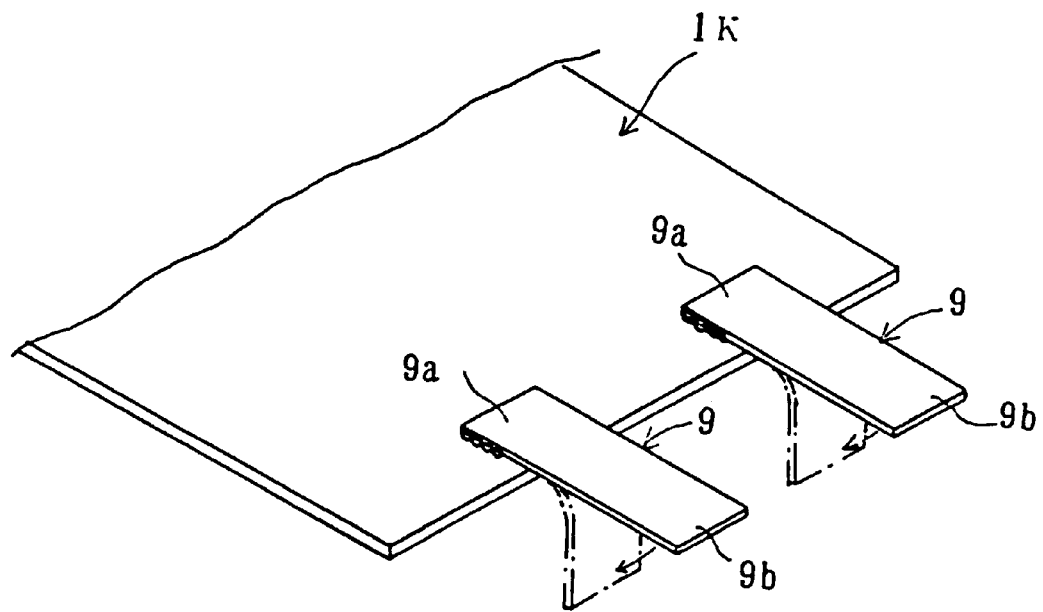
FIG. 28 is a principal oblique view showing a prior art example of a structure wherein terminals are installed on a circuit board.
Figure 29:
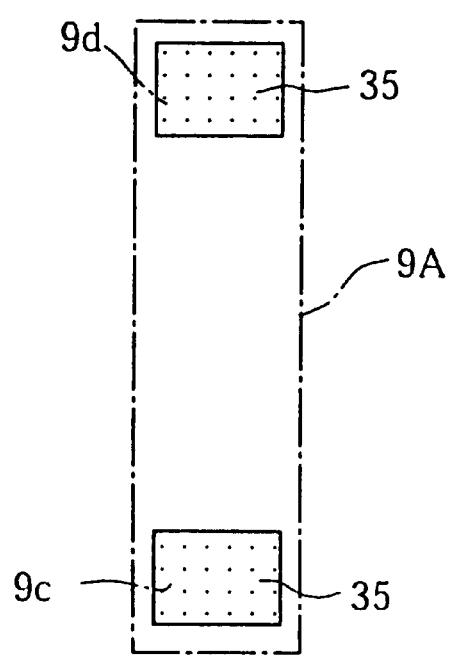
FIG. 29 is an illustrative diagram of a self-alignment effect obtained by means of a reflow soldering method.

Thereupon, after coating solder paste 3 onto the aforementioned pad regions 2H, terminals 4H are installed on the printed circuit board 1H, as illustrated in FIG. 27c, their connecting ends being superimposed on the regions where the solder paste 3 has been coated. The terminals 4H are made from nickel which is ferromagnetic. Therefore, the terminal 4H is fixed in the position in which it is placed on the printed circuit board 1H by means of the magnetic force of attraction generated by the magnet 7. Even if only the connecting end of the terminal 4H is mounted on the printed circuit board 1H in such a manner that the non-connecting end thereof projects beyond the printed circuit board 1H, it is still possible for the terminal 4H to be held in position by the aforementioned magnetic force of attraction. Consequently, if the printed circuit board 1H is subsequently heated by passing it through a solder reflowing furnace together with the magnet 7, the connecting end of the terminal 4H can be soldered appropriately to the printed circuit board 1H whilst being aligned accurately in a prescribed position.

The means for fixing the terminals using a magnet in the present invention is not limited to cases where the terminals are made from nickel, but rather can also be applied to cases where the terminals constitute another ferromagnetic material as their principal component. Moreover, the magnet need not necessarily by positioned in such a manner that it confronts the whole of one side of the printed circuit board, but rather it may be positioned specifically, only in regions corresponding to positions where terminals are to be installed.

In the embodiments described above, the non-connecting ends of the terminals soldered to the printed circuit board were caused to project outside the printed circuit board, but the present invention is not limited to this. The present invention can also be applied to cases where terminals are installed such that the non-connecting ends do not project outside the printed circuit board.

Furthermore, the terms "solderpaste" and "solder" referred to in the present invention are not limited to Sn—Pb alloy, but rather indicate a concept which also includes various solders for electronic engineering use containing other components. Moreover, the "circuit board" referred to in the present invention is not limited to printed circuit boards made from epoxy resin, or the like, but rather indicates a concept which includes flexible substrates, for example. Needless to say, the actual composition of the electronic circuits and electrical circuits fabricated on the circuit board is not limited.

Industrial Applicability

The method for installing terminals on a circuit board, and the circuit board, according to the present invention can be used in applications wherein terminals are attached to any type of circuit board forming electrical circuits or electronic circuits.

What is claimed is:

1. A method for installing a plurality of terminals onto a circuit board, each said terminal having a connecting end and a non-connecting end, the circuit board being provided with a plurality of connecting pads, the method comprising the steps of:

forming at least one solder paste deposit on each said pad;

forming at least one adhesive material deposit for each said pad;

superimposing the connecting end of each said terminal on the solder paste deposit at a respective one of the pads, the superimposing step including bringing the connecting end of each said terminal into contact with the adhesive material deposit for said respective pad; and heating the solder paste deposit on said respective pad to melt for soldering the connecting end of each said terminal to said respective pad, the heating step being performed while the connecting end of each said terminal is held provisionally bonded to said respective pad by means of the adhesive material deposit.

2. The method according to claim 1, wherein the adhesive material deposit is formed of a thermosetting adhesive material which undergoes thermosetting at a lower temperature than a melting temperature of the solder paste deposit.

3. The method according to claim 1, wherein the adhesive material deposit is formed on each said pad.

4. The method according to claim 1, wherein the adhesive material deposit is formed on a peripheral portion of each said pad, the superimposing step being performed in such a manner that the adhesive material deposit makes contact with an outer edge of the connecting end of each said terminal and projects beyond the connecting end.

5. The method according to claim 1, wherein the superimposing step is performed by superimposing the whole of each said terminal on the circuit board, and after soldering of the connecting end of each said terminal has been completed, cutting the circuit board between the connecting end and the non-connecting end of each said terminal, the non-connecting end of each said terminal is caused to project beyond a cut edge of the circuit board.

6. A method for installing a plurality of terminals onto a circuit board, each said terminal having a connecting end and a non-connecting end, the circuit board being provided with a plurality of connecting pads, the method comprising the steps of:

forming at least one solder paste deposit on each said pad;

superimposing the connecting end of each said terminal on the solder paste deposit on a respective one of the pads; and heating the solder paste deposit on said respective pad to melt for soldering the connecting end of each said terminal to said respective pad;

wherein the circuit board is provided with insulated inserting sections in corresponding relation to but separate from said pads, each of the insulated inserting sections corresponding in configuration to the connecting end of a respective one of the terminals;

wherein the superimposing step comprises fixing each said terminal by inserting the terminal into a respective one of the inserting sections; and wherein the heating step comprises causing the solder paste deposit to melt by heating while each said terminal is held in said respective inserting sections.

7. The method according to claim 5, wherein each said inserting section is a recess formed in the circuit board by press working.

8. The method according to claim 5, wherein each said inserting section is a recess formed in the circuit board by etching.

9. The method according to claim 5, wherein each said inserting section is a frame formed by conducting thick film printing on the circuit board.

10. The method according to claim 5, wherein the superimposing step comprises superimposing the whole of each said terminal on the circuit board, and after soldering of the connecting end of each said terminal has been completed, cutting said circuit board between the connecting end and the non-connecting end of each said terminal, the non-connecting end of each said terminal is caused to project beyond a cut edge of the circuit board.

11. A circuit board comprising:

a plurality of connecting pads;

at least one solder paste deposit formed on each of the pads; and a plurality of terminals each having a connecting end and a non-connecting end, each said terminal being soldered to a respective one of the pads via the connecting end by means of the solder paste deposit;

wherein the circuit board is provided with insulated inserting sections in corresponding relation to but separate from said pads, each of the insulated inserting sections corresponding in configuration to the connecting end of a respective one of the terminals, each said terminal being held in position by being inserted into a respective one of the inserting sections when the connecting end of each said terminal is superimposed on the solder paste deposit.

12. The circuit board according to claim 11, wherein each said inserting section is a recess formed in the circuit board by press working.

13. The circuit board according to claim 11, wherein each said inserting section is a recess formed in the circuit board by etching.

14. The circuit board according to claim 11, wherein each said inserting section is a frame formed by conducting thick film printing on the circuit board.

15. A method for installing a plurality of terminals onto a circuit board, each said terminal being made of a ferromagnetic material and having a connecting end and a non-connecting end, the circuit board having a first face and a second face opposite to said first face, the method comprising the steps of:

forming at least one solder paste deposit on the first face of the circuit board for each said terminal;

superimposing the connecting end of each said terminal on the solder paste deposit; and heating the solder paste deposit to melt for soldering the connecting end of each said terminal to the circuit board;

wherein the method further comprises a step of positioning a magnet such that it confronts the second face of the circuit board;

wherein the superimposing step comprises provisionally fixing each said terminal by magnetic force of the magnet when the connecting end of each said terminal is superimposed on the respective solder paste deposit;

wherein the heating step comprises causing the solder paste deposit to melt by heating while each said terminal is provisionally fixed by the magnetic force.

* * * * *